(12) United States Patent
Tada et al.

(10) Patent No.: US 7,212,081 B2
(45) Date of Patent: May 1, 2007

(54) MICROMACHINE AND METHOD OF PRODUCING THE SAME

(75) Inventors: Masahiro Tada, Kanagawa (JP);
Takashi Kinoshita, Kanagawa (JP);
Shun Mitarai, Kanagawa (JP);
Yasuyuki Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 61 days.

(21) Appl. No.: 10/537,132

(22) PCT Filed: Nov. 25, 2003

(86) PCT No.: PCT/JP03/14976

§ 371 (c)(1),
(2), (4) Date: Jun. 2, 2005

(87) PCT Pub. No.: WO2004/050545

PCT Pub. Date: Jun. 17, 2004

(65) Prior Publication Data

US 2006/0049895 A1    Mar. 9, 2006

(30) Foreign Application Priority Data

Dec. 3, 2002    (JP)    ............................. 2002-350639

(51) Int. Cl.
*H03H 9/24* (2006.01)
*B81B 3/00* (2006.01)
*B81C 1/00* (2006.01)

(52) U.S. Cl. ...................................... 333/186; 333/197

(58) Field of Classification Search ................ 333/186, 333/187, 188, 189, 191, 197
See application file for complete search history.

(56) References Cited

U.S. PATENT DOCUMENTS

| 6,744,335 B2 * | 6/2004 | Ryhanen et al. ............. 333/185 |
| 2003/0141946 A1 | 7/2003 | Ruby et al. |
| 2004/0245587 A1 * | 12/2004 | Tada et al. ................... 257/414 |
| 2005/0245011 A1 * | 11/2005 | Tada et al. ................... 438/197 |

FOREIGN PATENT DOCUMENTS

| EP | 1 100 196 A2 | 5/2001 |
| JP | 2-231808 | 9/1990 |
| JP | 10-111189 | 4/1998 |
| JP | 10-154820 | 6/1998 |
| JP | 11-340777 | 12/1999 |
| JP | 2000-111347 | 4/2000 |
| WO | 01/61848 | 8/2001 |
| WO | 03/054938 | 7/2003 |

OTHER PUBLICATIONS

European Search Report dated Nov. 7, 2006.
Japanese Officed Action issued on Sep. 12, 2006.

* cited by examiner

*Primary Examiner*—Dean Takaoka
(74) *Attorney, Agent, or Firm*—Sonnenschein Nath & Rosenthal LLP

(57) ABSTRACT

Disclosed is a micromachine as a high-frequency filter which includes a high Q value and is suitable for higher frequency bands. The micromachine (1) includes an output electrode (7) formed on a substrate (5), an interlayer insulating film (9) which covers the substrate (5) and includes an opening (9a) whose bottom is the output electrode (7), and a beltlike resonator electrode (11) so formed on the interlayer insulating film (9) as to traverse above the space (A) in the opening (9a), with the resonator electrode (11) being concave toward the opening (9a) along the side wall of the opening (9a).

10 Claims, 16 Drawing Sheets

Prior Art
F I G . 1 5 A
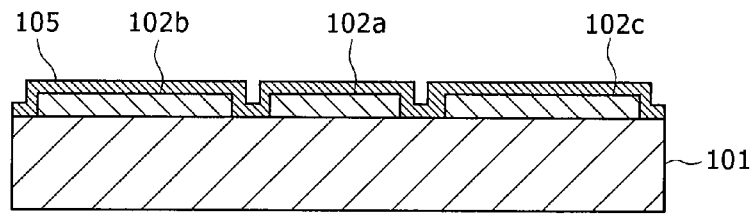
Prior Art
F I G . 1 5 B
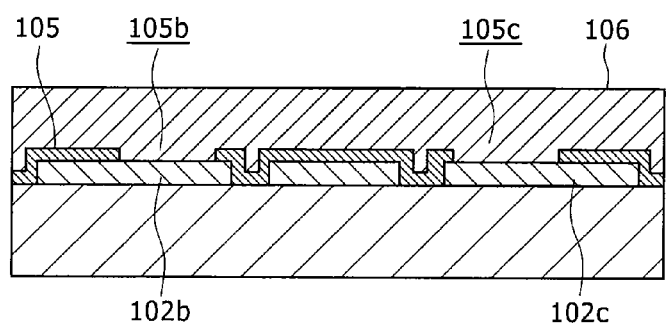
Prior Art
F I G . 1 5 C
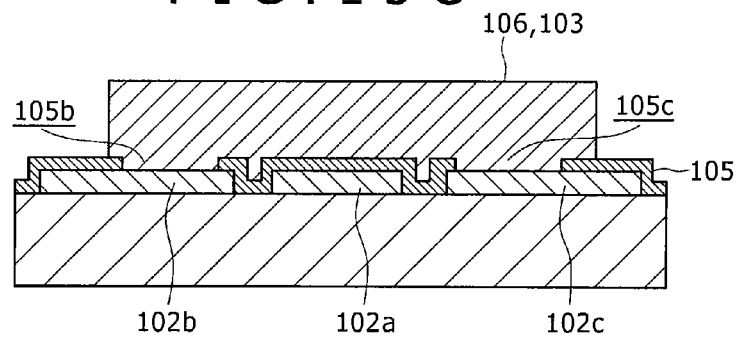

Prior Art

MICROMACHINE AND METHOD OF PRODUCING THE SAME

TECHNICAL FIELD

The present invention relates to a micromachine and a method for production thereof. More particularly, the present invention relates to a micromachine and a method for production thereof, the micromachine including the resonator electrode which traverses above the output electrode with a space interposed between them.

BACKGROUND ART

With recent advance in the technology of microfabrication on a substrate, much attention is now focused on the micromachine technologies to form on a substrate (such as silicon substrate and glass substrate) microstructures and their control components (such as electrodes and semiconductor integrated circuits).

One of such technologies is disclosed in Non-Patent Document 1. (C. T.-C. Nguyen, "Micromechanical Components for Miniaturized Low-power Communications" (Invited Plenary Proceedings), 1999 IEEE MTT-S International Microwave Symposium RF MEMS Workshop, Jun., 18, 1999, pp. 48–77.)

The author of this literature proposes using a microresonator as a high-frequency filter for wireless communications. FIG. 14 shows such a microresonator 100, which is comprised of a substrate 101, an output electrode 102a, and a resonator electrode 103, with a space A interposed. The resonator electrode 103 has its one end connected to the input electrode 102b which is made of the same conductive layer as the output electrode 102a. When a voltage with a specific frequency is applied to the input electrode 102b, the beam (vibrating part) 103a of the resonator electrode 103 (which is placed above the output electrode 102a, with a space A interposed) vibrates at a natural frequency. This vibration changes the capacity of the capacitor constructed of the space A between the output electrode 102a and the beam (vibrating part) 103a. This change is output through the output electrode 102a. The high-frequency filter relying on the microresonator 100 mentioned above realizes a higher Q-value than those relying on SAW (surface acoustic wave) or FBAR (film bulk acoustic resonator).

The microresonator mentioned above is produced in the following manner. First, referring to FIG. 15A, a substrate 101 coated with an insulating film is prepared. On this substrate 101 are formed from polysilicon an output electrode 102a, an input electrode 102b, and a supporting electrode 102c. The first one 102a is held between the second and third ones 102b and 102c. The substrate 101 and the electrodes 102a to 102c are entirely covered with a sacrificial layer 105 of silicon oxide.

Second, referring to FIG. 15B, contact holes 105b and 105c reaching the input electrode 102b and the supporting electrode 102c are made in the sacrificial layer 105. Then, a polysilicon layer 106 is formed on the sacrificial layer 105 and in the contact holes 105b and 105c.

Third, referring to FIG. 15C, the polysilicon layer 106 undergoes pattern etching, so that a beltlike resonator electrode 103 passing above the output electrode 102a is formed. Pattern etching is performed in such a way that the contact holes 105b and 105c are kept covered completely for protection of the input electrode 102b and the supporting electrode 102c from etching.

Finally, the sacrificial layer 105 is selectively removed to form a space A between the output electrode 102a and the resonator electrode 103. Thus, there is obtained the microresonator 100 as shown in FIG. 14.

The microresonator 100 constructed as mentioned above has a natural frequency which depends on its beam length L (the length of the beam 103a) as shown in FIG. 16. It is noted from FIG. 16 that the theoretical natural frequency according to the equation (1) below is proportional to $1/L^2$. This implies that it is necessary to reduce the beam length L in order to achieve a high natural frequency.

$$f_R = \frac{0.162h}{L^2}\sqrt{\frac{EK}{\rho}} \quad (1)$$

where, h: film thickness
E: Young's modulus
K: magnetic coupling ratio
$\rho$: film density The disadvantage of the above-mentioned microresonator 100 is that the beam length L cannot be made smaller than the width of the output electrode 102a because the space A and the resonator electrode 103 are formed over the output electrode 102a.

If the beam length L is to be reduced to increase the natural frequency, it is necessary to reduce the width of the output electrode 102a. This results in a decrease in capacity between the output electrode 102a and the resonator electrode 103, which in turn decreases output. This is the reason why it is impossible to increase the natural frequency by reducing the beam length L.

It is an object of the present invention to provide a micromachine and a method for production thereof, the micromachine having a resonator electrode that makes it possible to increase the natural frequency by reducing the beam length.

DISCLOSURE OF INVENTION

The above-mentioned object of the present invention is achieved by a micromachine which has an output electrode formed on a substrate and an interlayer insulating film formed on a substrate which has an opening whose bottom is the output electrode. A beltlike resonator electrode is so formed on the interlayer insulating film as to traverse above the space in the opening. The first micromachine according to the present invention is characterized in that the resonator electrode is concave to the opening along the side wall of the opening.

In the first micromachine constructed as mentioned above, the resonator electrode traversing the opening functions as the beam (or the vibrating part) of the resonator electrode. Therefore, the length of the vibrating part (or the beam length) is determined by the size of the opening irrespective of the width of the output electrode. Therefore, the resonator electrode may have the vibrating part which is shorter than the width of the output electrode. In addition, the lower surface of this resonator electrode is supported by the upper surface of the interlayer insulating film and the side of the vibrating part is supported by the side wall of the opening. Therefore, the resonator electrode is firmly supported by the interlayer insulating film, and this causes only the vibrating part to contribute to vibration. Moreover, the vibrating part is made shorter as much as the thickness of the resonator electrode arranged along the side wall of the opening and consequently the substantial length of the vibrating part is shorter than the aperture size of the opening.

The second micromachine according to the present invention is characterized in that both ends of the resonator electrode which are positioned at both sides of the opening are held between the interlayer insulating film and the insulating film formed thereon.

The second micromachine constructed as mentioned above produces the effect as the first one. That is, that part of the resonator electrode which traverses above the opening functions as the vibrating part of the resonator electrode. Therefore, the resonator electrode can have a shorter vibrating part than the width of the output electrode. In addition, this resonator electrode is formed such that both ends of the vibrating part (which are at both sides of the opening) are held between the interlayer insulating film and the insulating film formed thereon. Therefore, the resonator electrode is firmly held by the interlayer insulating film and the insulating film, and only the vibrating part is made to contribute to vibration.

The present invention is directed also to the method for producing the first and second micromachines constructed as mentioned above.

BRIEF DESCRIPTION OF DRAWINGS

FIGS. 15A to 15C are sectional views showing the related-art production method.

BEST MODE FOR CARRYING OUT THE INVENTION

In what follows, the embodiments of the present invention will be described in more detail with reference to the accompanying drawings. Each embodiment deals with the structure and production method of the micromachine as a microresonator suitable for use as a high-frequency filter.

First Embodiment

Figure 1A:
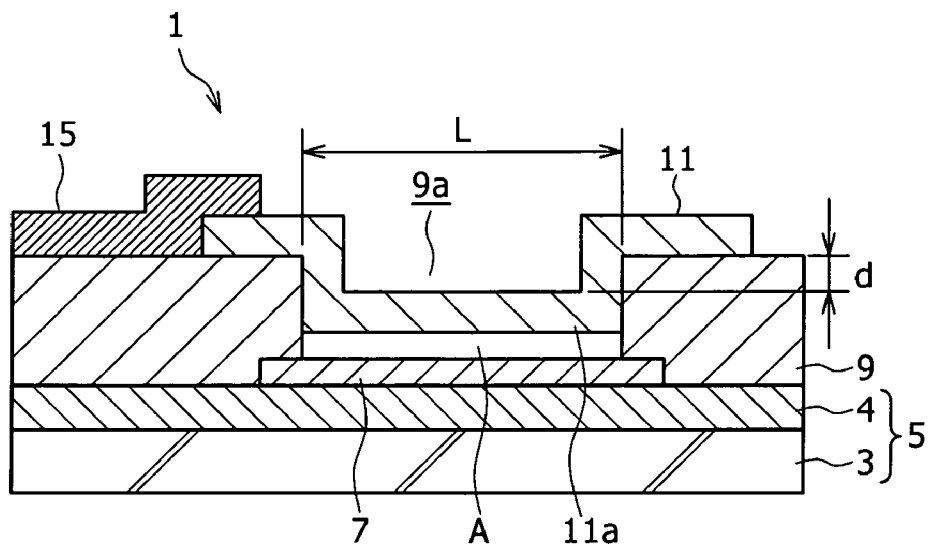
FIGS. 1A and 1B are a sectional view and a plan view, respectively, of the micromachine according to a first embodiment of the present invention.
Figure 1B:
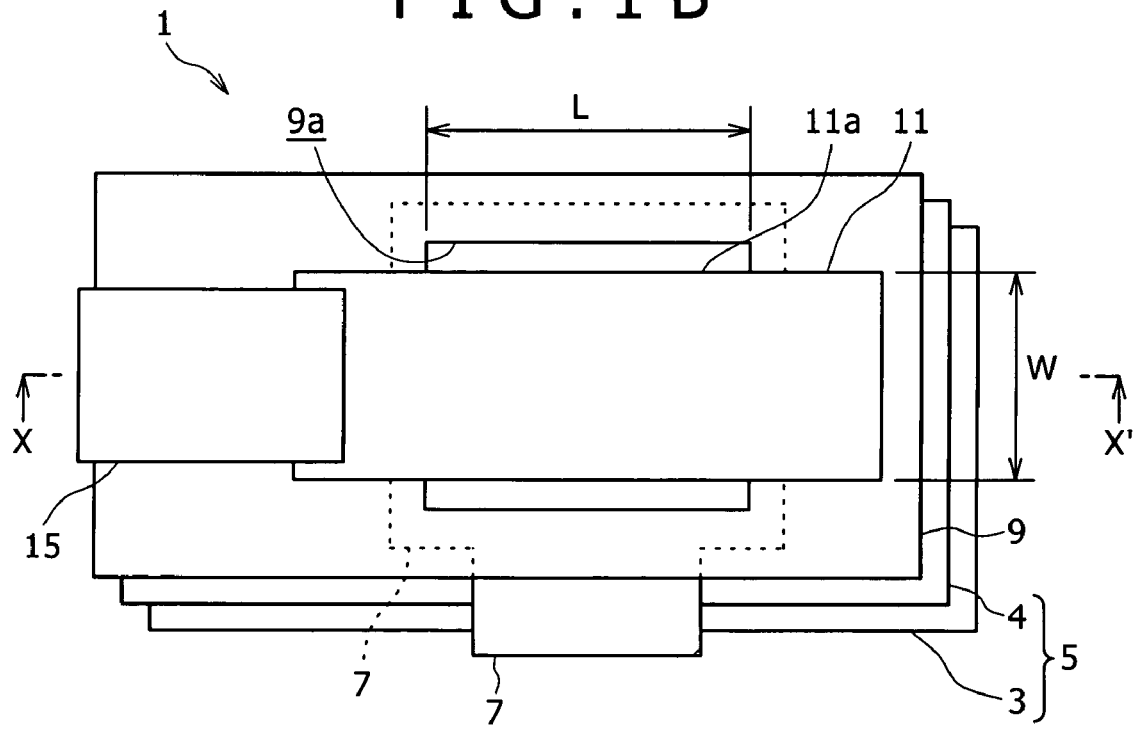

FIG. 1A is a sectional view showing the structure of the micromachine according to the first embodiment, and FIG. 1B is a plan view showing the structure of the micromachine according to the first embodiment. The cross section in FIG. 1A is taken along the line X–X' in FIG. 1B.

The micromachine 1 shown in these figures is formed on a substrate 5, which consists of a semiconductor substrate 3 and an insulating film 4 covering its surface. On the substrate 5 is formed a pattern of an output electrode 7. The output electrode 7 has a lead projecting from the micromachine 1 along the substrate 5.

On the substrate 5 is an interlayer insulating film 9 which covers the output electrode 7. This interlayer insulating film 9 should preferably be formed flat in such a way as to embed the output electrode 7, although this is not limitative. It may cover the output electrode 7 with its surface configuration conforming to the placement of the output electrode 7.

The interlayer insulating film 9 has an opening 9a reaching the output electrode 7. This opening 9a is positioned only above the output electrode 7 without protruding from the output electrode 7. The length L of the opening 9a is one of the factors that determine the frequency of the micromachine 1. Therefore, the opening 9a should have the length L which corresponds to the frequency required of the high-frequency filter constructed of the micromachine 1.

On the interlayer insulating film 9 is a beltlike resonator electrode 11 which traverses the upper part of the space A in the opening 9a. That part of the resonator electrode 11 which coincides with the space A (or the opening 9a) functions as the vibrating part (beam) 11a. In other words, the length L of the opening 9a is the beam length L of the vibrating part (beam) 11a of the micromachine 1. The resonator electrode 11 is formed such that the vibrating part 11a is concave along the side wall of the opening 9a. The concave part of the resonator electrode 11 (or the center of the vibrating part 11a) is a certain distance (d) below from the upper surface of the interlayer insulating film 9. The value of d may be 0.2 μm, for instance.

On the interlayer insulating film 9 is a lead 15 connected to the resonator electrode 11. Incidentally, the lead 15 may be formed from the same layer as the resonator electrode 11.

The above-mentioned micromachine according to the first embodiment is produced by the method which is described below with reference to FIGS. 2A to 2D and FIGS. 3A to 3C (which are sectional views).

Figure 2A:
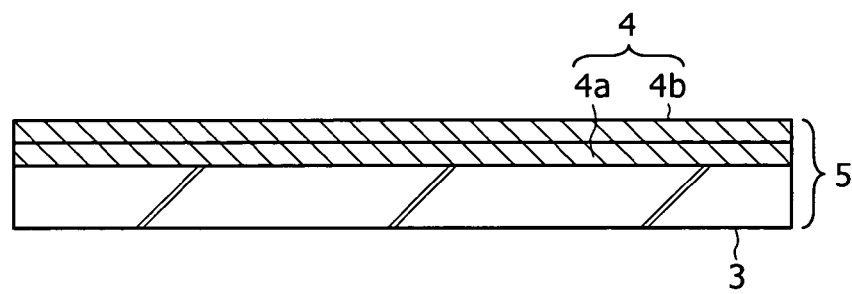
FIGS. 2A to 2D are sectional views showing the production method (part one) according to the first embodiment of the present invention.

First, a substrate 5 is prepared, which consists of a semiconductor substrate 3 (of single-crystal silicon) and an insulating film 4 covering it, as shown in FIG. 2A. The insulating film 4 should preferably be coated with a top layer made of a material which is resistant to etching to be performed subsequently on the sacrificial layer (e.g., silicon oxide). Therefore, the insulating film 4 is formed from a silicon oxide film 4a and a silicon nitride film 4b which are laminated on top of the other. The silicon oxide film 4a relieves stress between the upper layer and the semiconductor substrate 3. The silicon nitride film 4b is resistant to etching. These two films may be formed by low-pressure CVD, for instance.

Figure 2B:
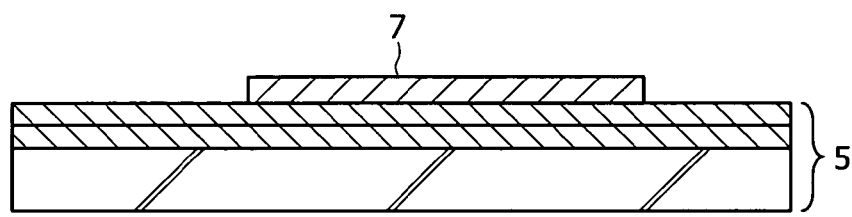

Next, an output electrode 7 is formed on the substrate 5 by patterning a first conductive layer, as shown in FIG. 2B. The first conductive layer from which the output electrode 7 is formed should be a silicon layer of polysilicon containing phosphorus (P), for instance. The patterning of the first electrode layer and other parts (mentioned later) should be performed through a resist pattern (as a mask) formed by lithography.

Figure 2C:
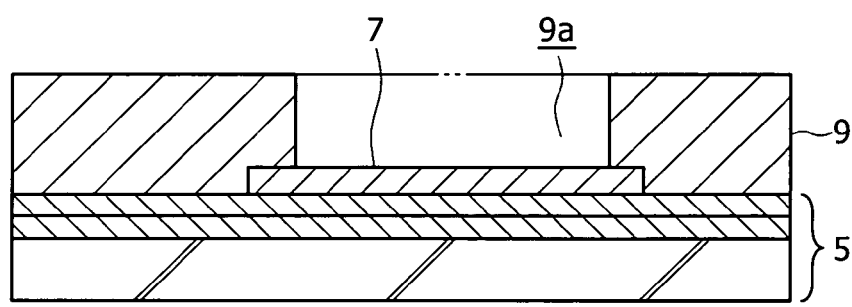

The substrate 5 and the output electrode 7 are covered with an interlayer insulating film 9, as shown in FIG. 2C. The interlayer insulating film 9 should be thick enough to completely cover the output electrode 7. The surface of the interlayer insulating film 9 should preferably be planarized subsequently. The interlayer insulating film 9 should be made of a material resistant to etching to be performed subsequently on the sacrificial layer. In the case where the sacrificial layer is formed from silicon oxide, the interlayer insulating film 9 should be formed from silicon nitride. Incidentally, the interlayer insulating film 9 does not need to have a flat surface that covers the output electrode 7. It may have a surface conforming to the shape of the output electrode 7. The interlayer insulating film 9 of silicon nitride may be formed by low-pressure CVD, for instance.

An opening 9a (reaching the output electrode 7) is made in the interlayer insulating film 9. This opening 9a should have a shape which is within the configuration of the output electrode 7. Thus, the output electrode 7 constitutes the bottom of the opening 9a.

Figure 2D:
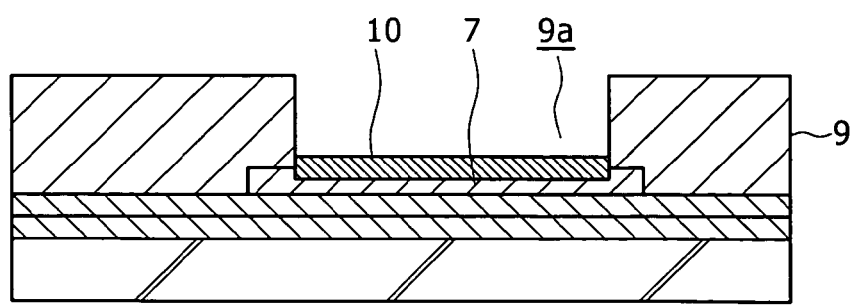

That part of the output electrode 7 which is exposed at the bottom of the opening 9a is covered with the sacrificial layer 10, as shown in FIG. 2D. The sacrificial layer 10 should be made of silicon oxide or the like, which can be selectively removed by subsequent etching, with no effect on the interlayer insulating film 9 and the output electrode 7. In practice, the sacrificial layer 10 of silicon oxide is formed by oxidizing the exposed surface of the output electrode 7 of polysilicon, with the interlayer insulating film 9 of silicon nitride masked. It is important that the sacrificial layer 10 should be formed in such a way that the surface of the sacrificial layer 10 is sufficiently lower than the surface of the interlayer insulating film 9 or the opening 9a remains concave even after the sacrificial layer 10 has been formed.

Figure 3A:
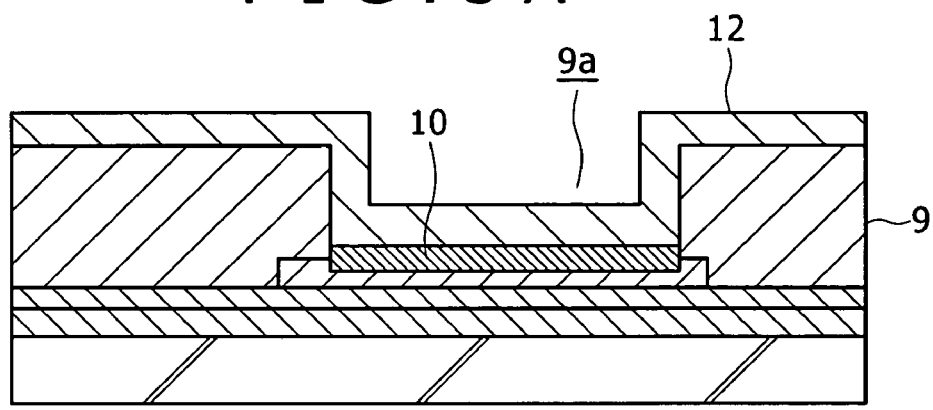
FIGS. 3A to 3C are sectional views showing the production method (part two) according to the first embodiment of the present invention.

A second conductive layer 12 is formed on the interlayer insulating film 9 in such a way that it covers the inside wall of the opening 9a whose bottom has been covered with the sacrificial layer 10, as shown in FIG. 3A. The second conductive layer 12 should be made of a material resistant to etching to be performed subsequently on the sacrificial layer 10. Consequently, it should be formed from polysilicon in the case where the sacrificial layer 10 is made of silicon oxide. The second conductive layer 12 should have a thickness which is established such that the surface which is concave to the opening 9a is lower than the surface of the interlayer insulating film 9.

Figure 3B:
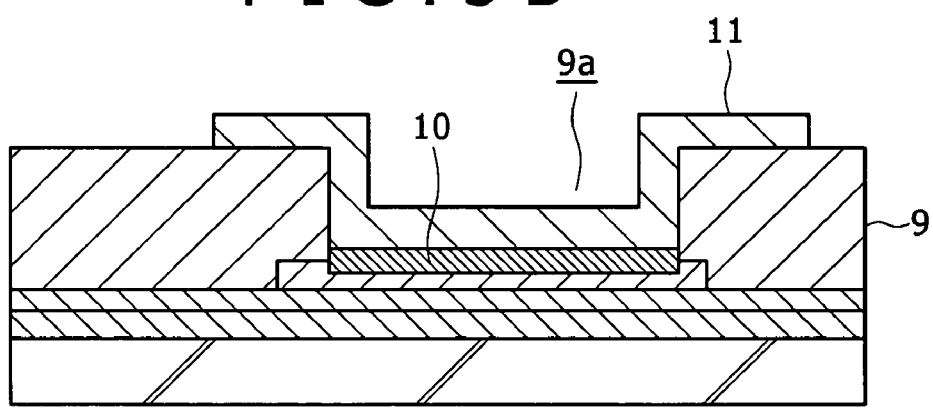

The second conductive layer 12 is patterned, so that the resonator electrode 11 is formed above the sacrificial layer 10 and the interlayer insulating film 9, as shown in FIG. 3B. The resonator electrode 11 should be formed in a beltlike pattern which traverses the sacrificial layer 10 and allows the opening 9a and the sacrificial layer 10 (formed in the opening 9a) to be partly exposed. The opening 9a may be exposed at both sides of the resonator electrode 11, as shown in FIG. 1B. Alternatively, the opening 9a and the sacrificial layer 10 may be exposed at one side in the W (width) direction (perpendicular to the beam length L) of the resonator electrode 11.

Figure 3C:
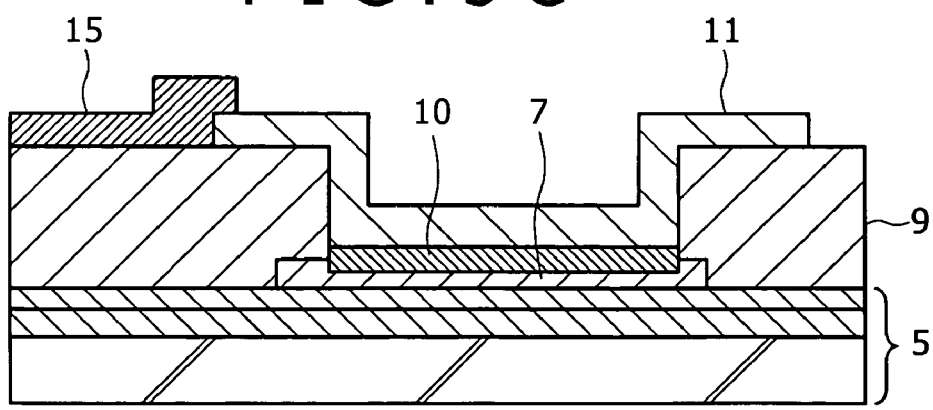

The lead 15 connecting to the resonator electrode 11 is formed on the interlayer insulating film 9, as shown in FIG. 3C. This step may be carried out in the following manner. First, a seed layer of gold (Au) (not shown) is formed on the entire surface of the substrate 5. Next, a resist pattern (not shown) is formed which covers the seed layer excluding that part where the lead is to be formed. The lead 15 is formed by plating on the seed layer within the opening part of the resist pattern. The resist pattern is removed, and etching is performed on the entire surface to remove the seed layer. Incidentally, this step is not necessary in the case where the lead 15 and the resonator electrode 11 are formed from the same layer.

The sacrificial layer 10 of silicon oxide (under the resonator electrode 11) is removed by selective wet etching with buffered hydrofluoric acid which leaves intact the lead 15, the resonator electrode 11, the interlayer insulting film 9, and the output electrode 7.

The foregoing steps form the space A under the resonator electrode 11 and cause the output electrode 7 to be exposed at the bottom of the opening 9a, as shown in FIGS. 1A and 1B. In this way there is obtained the micromachine 1 which has the beltlike resonator electrode 11 traversing above the interlayer insulating film 9 and the space A in the opening 9a.

The above-mentioned micromachine 1 according to the first embodiment has the resonator electrode 11 which traverses above the space A in the opening 9a formed in the interlayer insulting film 9. Upon application of a voltage of specific frequency, the beam 11a (vibrating part) of the resonator electrode 11 (which traverses above the opening 9a) vibrates. Thus, the length of the vibrating part (or beam) 11a (beam length L) is determined by the size of the opening 9a.

The advantage of the micromachine 1 according to the first embodiment, which is constructed as shown in FIGS. 1A and 1B, is that the beam length L of the resonator electrode 11 can be reduced to the achievable minimum size of the opening 9a regardless of the line width of the output electrode 7. This advantage, however, is not gained by the related-art micromachine in which the space A and the resonator electrode 103 are arranged over the output electrode 102a, as explained above with reference to FIG. 14. The resulting micromachine may be adaptable to higher frequencies owing to its much reduced beam length L.

Figure 14:
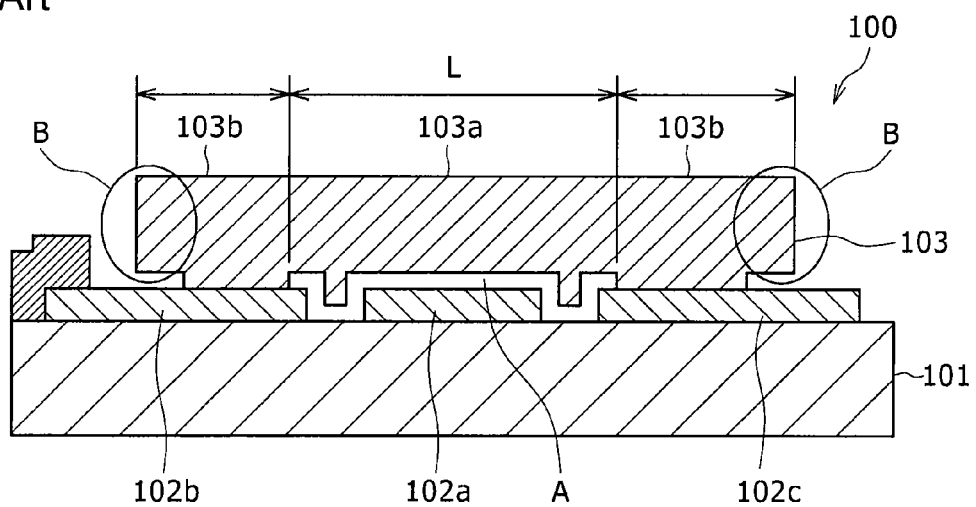
FIG. 14 is a diagram showing the structure of a related-art micromachine (microresonator).
Figure 16:
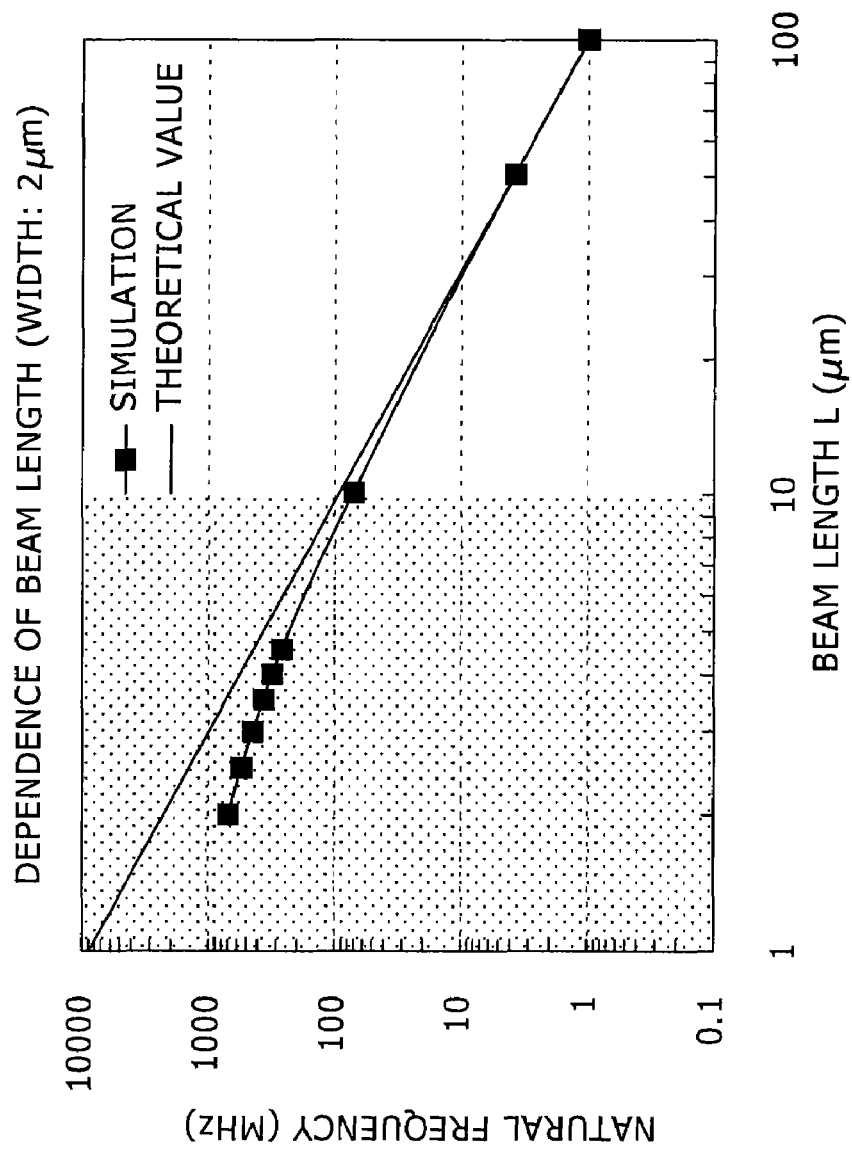
FIG. 16 is a graph illustrating the problems with the related-art micromachine.

The micromachine 1 according to the first embodiment differs from the related-art micromachine shown in FIG. 14 in the capacity that occurs between the resonator electrode 11 and the output electrode 7. The former has a larger capacity for the same beam length L because of the large opposing area of the resonator electrode 11 and the output electrode 7. This implies that it maintains a high output even when the beam length L is reduced for high frequencies.

The micromachine 1 according to the first embodiment is constructed as follows. Both ends of the resonator electrode 11 (or the anchors supporting the vibrating part 11a) are entirely fixed to the interlayer insulating film 9 and the sides of the vibrating part 11a are supported by the side wall of the opening 9a. This implies that the resonator electrode 11 is firmly supported by the interlayer insulting film 9 and only the vibrating part 11a efficiently contributes to vibration. As the result, a voltage of specific frequency applied to the micromachine 1 causes vibration to take place only in the beam (vibrating part) 11a of the resonator electrode 11.

Consequently, the natural frequency is close to the theoretical value meeting the equation (1) given above (the value inversely proportional to the square of the length L of the vibrating part). This makes the micromachine 1 adaptive easily to high frequencies.

Another advantage of the micromachine 1 is that the vibrating part 11a of the resonator electrode 11 is shorter by its thickness placed along the side wall of the opening 9a. This implies that the length of the vibrating part which actually vibrates is shorter than the width of the opening 9a. This makes the micromachine 1 adaptive easily to high frequencies.

Figure 4:
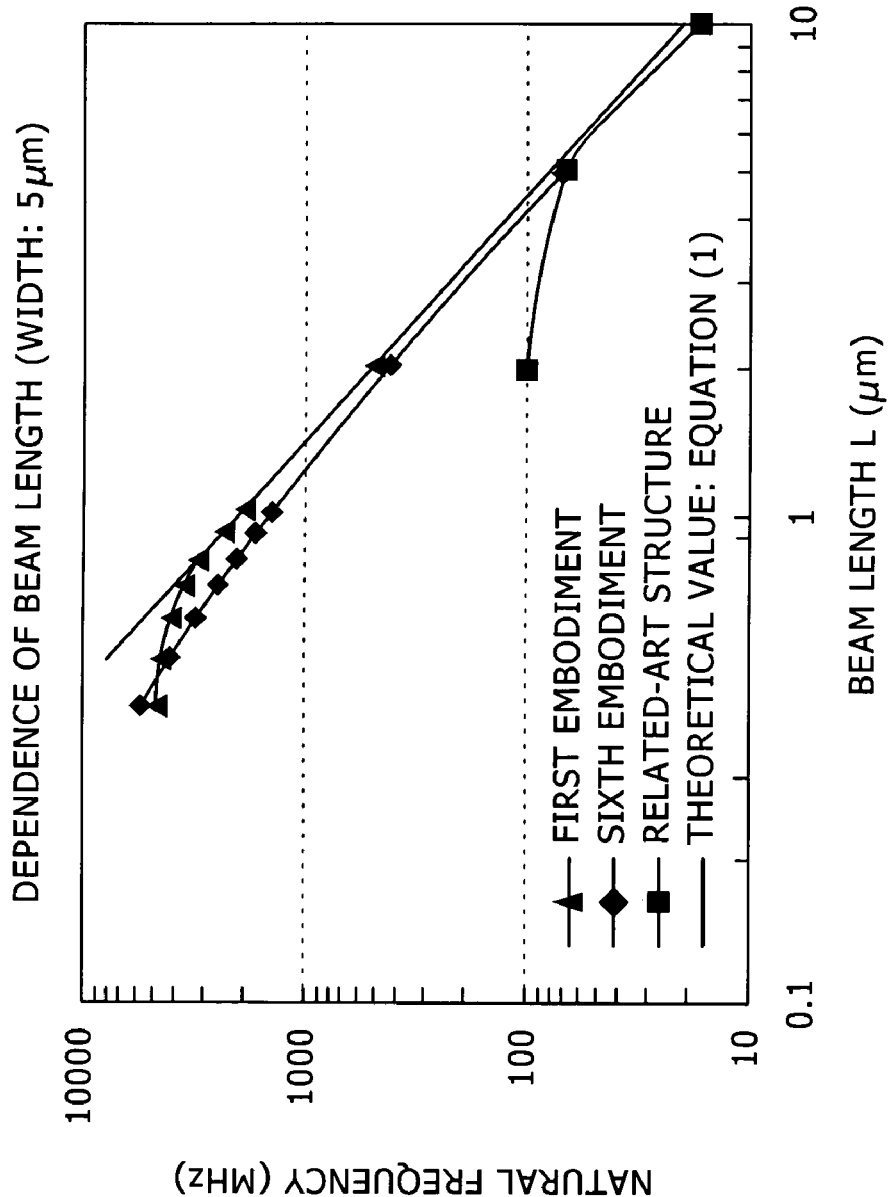
FIG. 4 is a graph showing the result of simulation to predict how the beam length (L) affects the natural frequency.

FIG. 4 shows the result of simulation to predict how the natural frequency varies depending of the beam length L in the micromachine. It is to be noted that in the case of the micromachine according to the first embodiment, the dependence of natural frequency of the beam length is close to the theoretical value meeting the equation (1) given above. This result indicates that the micromachine 1 can be made to easily suit high frequencies by miniaturization.

The foregoing does not apply to the related-art micromachine shown in FIG. 14 because of its structure restricted by its manufacturing process. That is, the anchor part supporting the beam (vibrating part) 103a has a projecting part B which is not in close contact with the underlying layer, and this projecting part B affects the vibration of the beam (vibrating part) 103a. This is evident from the fact that the natural frequency decreases from the theoretical value meeting the equation (1) given above as the beam length L is reduced. This implies that the micromachine cannot be made to suit high frequencies by reducing the beam length L.

It is concluded from the foregoing that the micromachine 1 constructed according to the first embodiment can be used as a high-frequency filter with a high Q value.

The advantage of planarizing the surface of the interlayer insulating film 9 (in which the output electrode 7 is embedded) is that the parasitic capacity (that part of capacity which does not contribute to vibration) which occurs between the resonator electrode 11 and the output electrode 7 is minimized, with the interlayer insulating film 9 interposed between them. Therefore, the micromachine 1 as a high-frequency filter can have an improved frequency selectivity (transmission property).

Incidentally, the first embodiment has been explained above on the assumption that the width W of the resonator electrode 11 is the same, as shown in FIG. 1B. However, the resonator electrode 11 may be modified such that its both ends on the interlayer insulating film 9 are wider than its central part. This structure ensures the supporting of the beam (vibrating part) 11a.

Second Embodiment

Figure 5A:
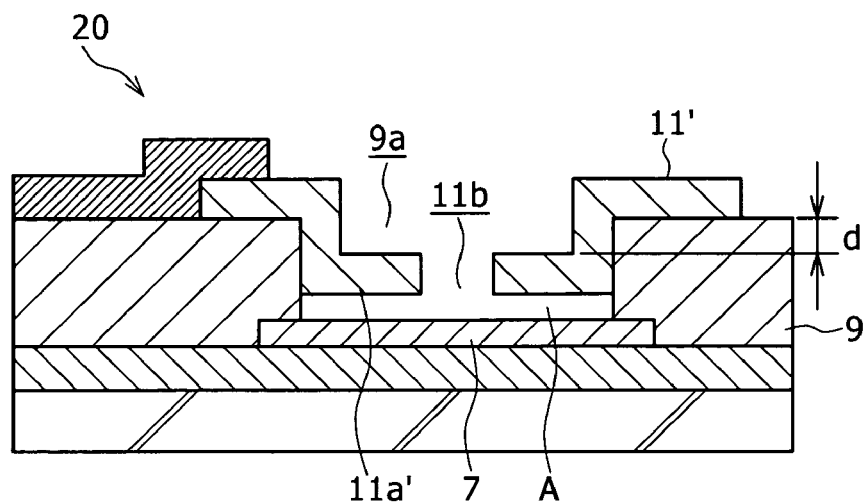
FIGS. 5A and 5B are a sectional view and a plan view, respectively, of the micromachine according to a second embodiment of the present invention.
Figure 5B:
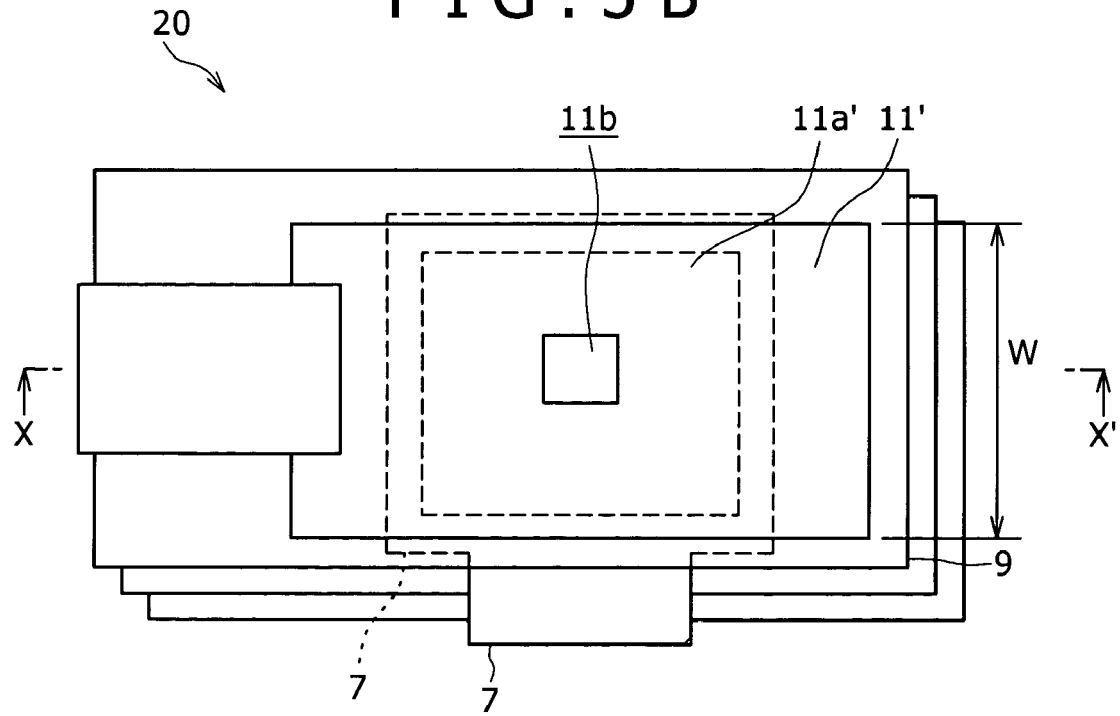

FIG. 5A is a sectional view showing the structure of the micromachine according to a second embodiment, and FIG. 5B is a plan view showing the structure of the micromachine according to the second embodiment. The cross section in FIG. 5A is taken along the line X–X' in FIG. 5B.

The micromachine 20 according to the second embodiment is similar to the micromachine according to the first embodiment (which has been mentioned above with reference to FIGS. 1A and 1B) except for the structure of the resonator electrode 11'.

The resonator electrode 11' of the micromachine 20 shown in FIGS. 5A and 5B, which is formed in the opening 9a has a width W large enough to cover the space A in the opening 9a made in the interlayer insulating film 9. It also has an opening 11b which reaches the space A. That part of the resonator electrode 11' which is above the space A and conforms to the opening 9a functions as the vibrating part 11a' as in the case of the micromachine according to the first embodiment.

The resonator electrode 11' may have only one opening 11b (as shown) or two or more openings. The ratio of the area of the opening 11b to the area of the opening 9a and the arrangement and number of the opening 11b should be properly adjusted so that the micromachine 20 according to the second embodiment, which is used as a high-frequency filter, gives a desired output for a specific frequency range.

In the same way as in the first embodiment, the vibrating part 11a' of the resonator electrode 11' should be concave toward the opening 9a along the side wall of the opening 9a and the upper surface of the concave part (or the central part of the vibrating part 11a') should be lower than the top surface of the interlayer insulating film 9, with the difference being an arbitrary value indicated by d.

The micromachine 20 which has the resonator electrode 11' constructed as mentioned above may be produced in a way similar to that of the first embodiment. In the step of forming the resonator electrode shown in FIG. 3B, the resonator electrode is formed which covers the opening 9a and has an opening which reaches the sacrificial layer 10 in the opening 9a, and the sacrificial layer 10 is selectively removed by etching through this opening.

The micromachine according to the second embodiment, which is constructed as mentioned above with reference to FIGS. 5A and 5B, is characterized in that there is a space A in the opening 9a and the resonator electrode 11' is placed above it, and the resonator electrode 11' has an opening 11b communicating with the space A. Therefore, upon application of a voltage of specific frequency, the resonator electrode 11' (closing the opening 9a) vibrates, functioning as the vibrating part 11a'. The beam length L of the vibrating part 11a' is determined by the size of the opening 9a. As in the case of the micromachine according to the first embodiment, the beam length L can be established according to the size of the opening 9a regardless of the width of the output electrode 7. Thus, the micromachine can be made adaptive to high frequencies by reducing the beam length L, while keeping the desired level of output.

Another feature of the micromachine 20 according to the second embodiment is that the resonator electrode 11' closes the opening 9a such that the beam (vibrating part) 11a' is firmly held by the interlayer insulating film 9 over the entire periphery. Moreover, both ends of the resonator electrode 11' (or the anchor parts supporting the beam (vibrating part) 11a') are fixed to the interlayer insulating film 9 over their entire surface and the side of the vibrating part 11a' is supported by the side wall of the opening 9a. This structure supports the resonator electrode 11' more firmly and hence adaptive to higher frequencies than the structure of the micromachine according to the first embodiment.

Third Embodiment

Figure 6:
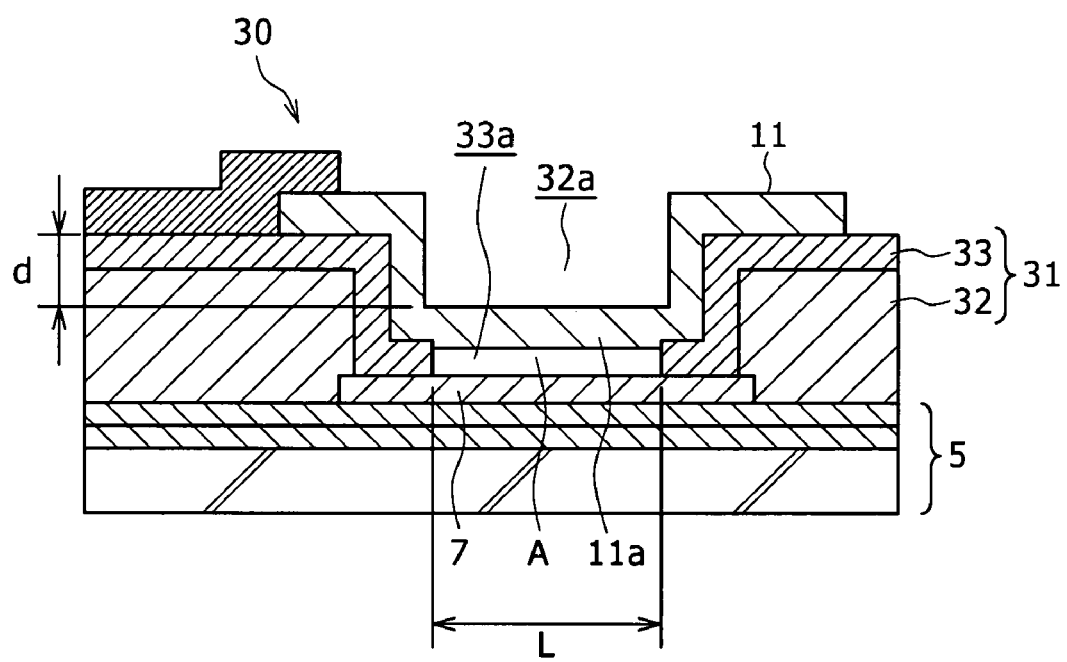
FIG. 6 is a sectional view of the micromachine according to a third embodiment of the present invention.

FIG. 6 is a sectional view showing the structure of the micromachine according to a third embodiment. The micromachine 30 according to the third embodiment is similar to the micromachine according to the first embodiment (which has been mentioned above with reference to FIGS. 1A and 1B) except for the structure of the interlayer insulating film 31.

In the micromachine 30, the interlayer insulating film 31, which is so formed on the substrate 5 as to partly cover the output electrode 7, is composed of a first layer 32 and a second layer 33.

The first layer 32 should have a sufficient thickness to embed the output electrode 7. The first layer 32 should preferably have a smooth surface, but this is not limitative. It may have an irregular shape conforming to the arrangement of the output electrode. It has an opening 32a reaching the output electrode 7. It is desirable that the opening 32a should not protrude from the output electrode 7 but be confined within the area of the output electrode 7, although this is not limitative.

The second layer 33 is much thinner than the first layer 32. It is formed on the first layer 32 in such a way that it tightly covers the inner wall of the opening 32a of the first layer 32. The second layer 33 should be thick enough to protect the first layer 32, and its thickness should be equal to or slightly larger than the height of the space A placed under the resonator electrode 11. The second layer 32 has an opening 33a reaching the output electrode 7. The opening 33a is formed inside the opening 32a of the first layer 32. It is arranged above the output electrode 7, without projecting from the output electrode 7, and it is formed such that the first layer 32 is not exposed. The output electrode 7 is covered with the second layer 33 with a specific width (length).

The resonator electrode 11 (which is formed on the interlayer insulating film 31 composed of the first layer 32 and the second layer 33) is concave toward the opening 32a along the side wall of the opening 32a in the first layer 32. In addition, the resonator electrode 11 traverses the space A in the opening 33a of the second layer 33. That part of the resonator electrode 11 which is above the space A (or which coincides with the opening 33a) functions as the vibrating part (beam) 11a.

The resonator electrode 11 may be concave toward the opening 33a (or the space A) along the side wall of the opening 33a of the second layer 33. In this case, the resonator electrode 11 may be concave stepwise toward the output electrode 7, and the side of the vibrating part 11a is supported stepwise. Incidentally, as in the first embodiment, the vibrating part 11a should preferably be formed such that the surface of its central part is lower by an arbitrary value (d) than the surface of the interlayer insulating film 31 (the second layer 33).

The above-mentioned micromachine according to the third embodiment is produced by the method which is described below with reference to FIGS. 7A to 7D and FIGS. 8A to 8C (which are sectional views).

Figure 7A:
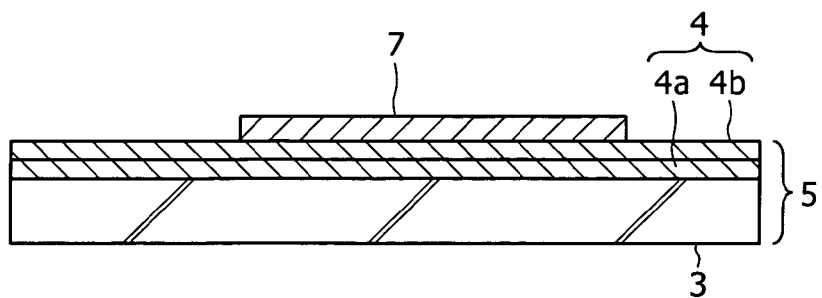
FIGS. 7A to 7D are sectional views showing the production method (part one) according to the third embodiment of the present invention.

First, a substrate 5 is prepared by coating a semiconductor substrate 3 with an insulating film 4 as shown in FIG. 7A. On the substrate 5 is formed the output electrode 7. The steps up to this stage are the same as those explained above with reference to FIGS. 2A and 2B.

Figure 7B:
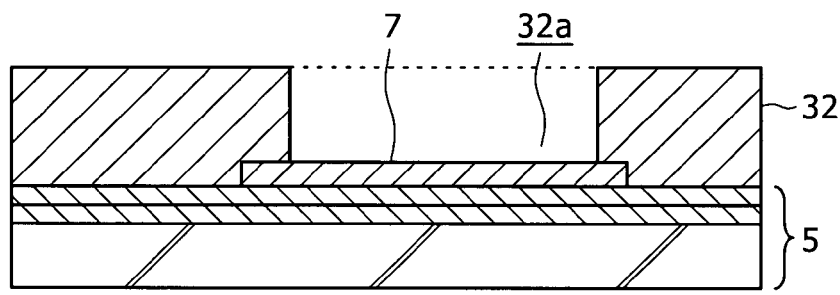

Next, the first layer 32 of silicon oxide is formed which covers the output electrode 7 and the substrate 5, as shown in FIG. 7B. The first layer 32 should be thick enough to completely cover the output electrode 7, and it should be subsequently planarized. In the first layer 32 is made the opening 32a which reaches the output electrode 7.

Figure 7C:
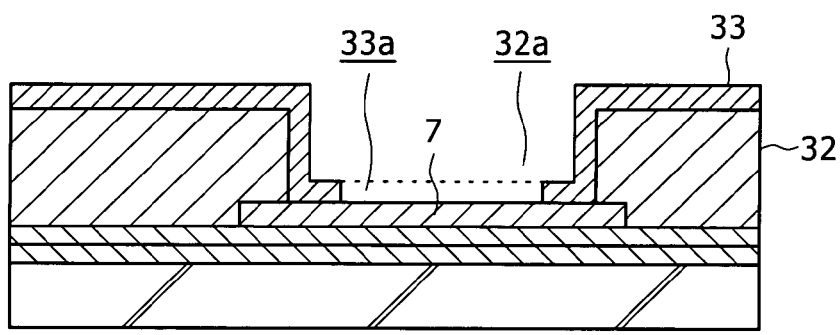

The second layer 33, which is sufficiently thinner than the first layer 32, is formed in such a way as to cover the inside wall of the opening 32a of the first layer 32, as shown in FIG. 7C. The second layer 33 should be formed from an insulating material which is resistant to etching to be performed subsequently on the sacrificial layer. The material for the second layer 33 may be silicon nitride if silicon oxide is used for the sacrificial layer.

In the second layer 33 is formed the opening 33a which reaches the output electrode 7. This opening 33a should be made such that it does not protrude from the output electrode 7; thus the output electrode 7 forms the bottom of the opening 33a.

Figure 7D:
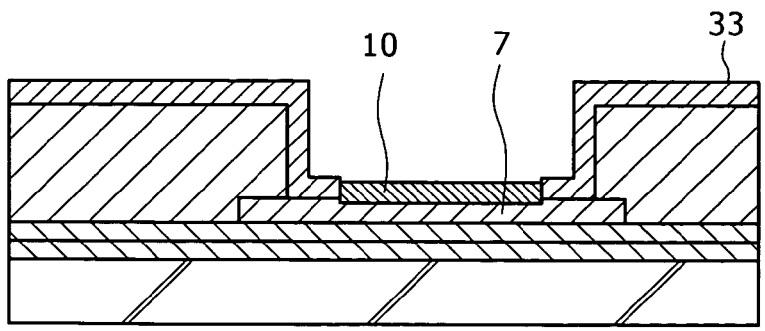

Then, the sacrificial layer 10 is formed which covers the surface of the output electrode 7 which is exposed at the bottom of the opening 33a, as shown in FIG. 7D. The material for the sacrificial layer 10 is silicon oxide, for example, which can be selectively removed from the second layer 33 and the output electrode 7. The sacrificial layer 10 should be formed in the same way as explained in the first embodiment with reference to FIG. 2D. It is important that the sacrificial layer 10 should be formed such that its surface is barely or slightly lower than the surface of the second layer 33.

Figure 8A:
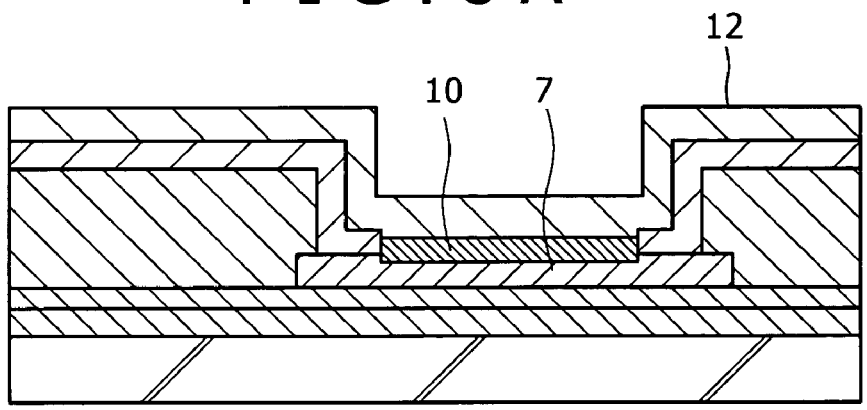
FIGS. 8A to 8C are sectional views showing the production method (part two) according to the third embodiment of the present invention.
Figure 8B:
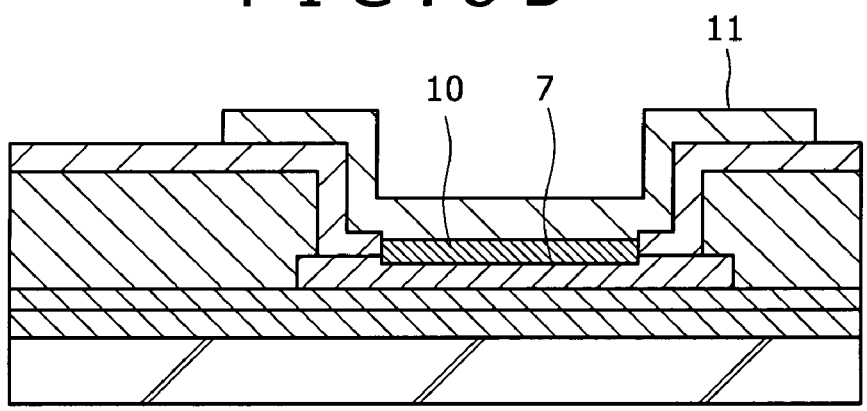
Figure 8C:
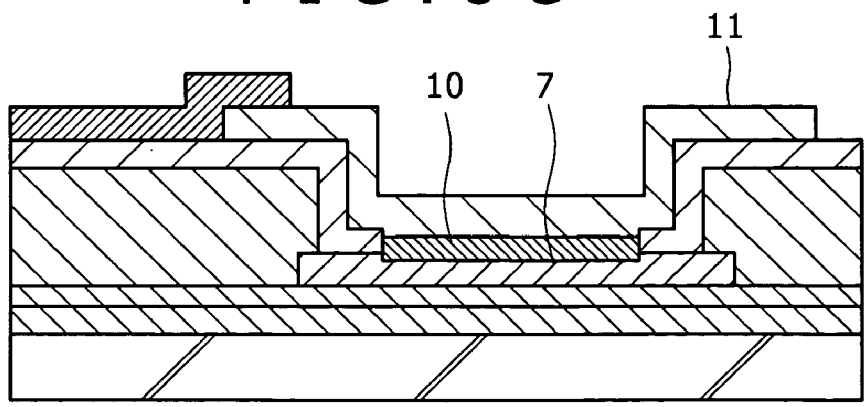

The subsequent steps shown in FIGS. 8A to 8C are carried out in the same way as the steps explained in the first embodiment with reference to FIGS. 3A to 3C, provided that the removal of the sacrificial layer 10 is accomplished by selective etching for the lead 15, the resonator electrode 11, the second layer 33, and the output electrode 7.

The foregoing steps yield the micromachine 30 as shown in FIG. 6, which has the space A (which is left after removal of the sacrificial layer) under the resonator electrode 11 and which has the output electrode 7 (at the bottom of the opening 33a) which is exposed to the space A. The micromachine 30 also has the beltlike resonator electrode 11 which traverses the opening 33a above the space A in the opening 33a.

The above-mentioned micromachine 30 according to the third embodiment has the resonator electrode 11 which traverses above the space A in the opening 33a, and the side of the beam (vibrating part) 11a of the resonator electrode 11 is supported by the side walls of the openings 32a and 33a. Therefore, it has a high Q value as in the case of the micromachine according to the first embodiment. It will find use as a high-frequency filter for higher frequency bands.

Fourth Embodiment

Figure 9A:
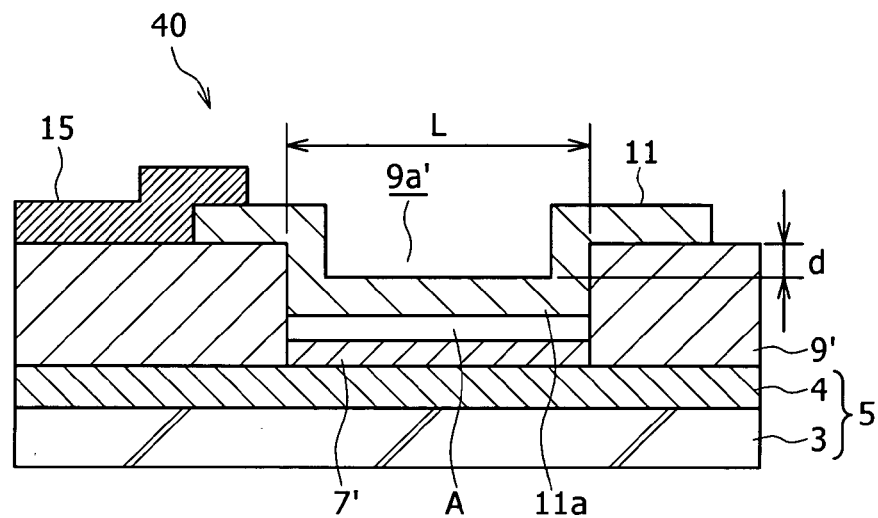
FIGS. 9A and 9B are a sectional view and a plan view, respectively, of the micromachine according to a fourth embodiment of the present invention.
Figure 9B:
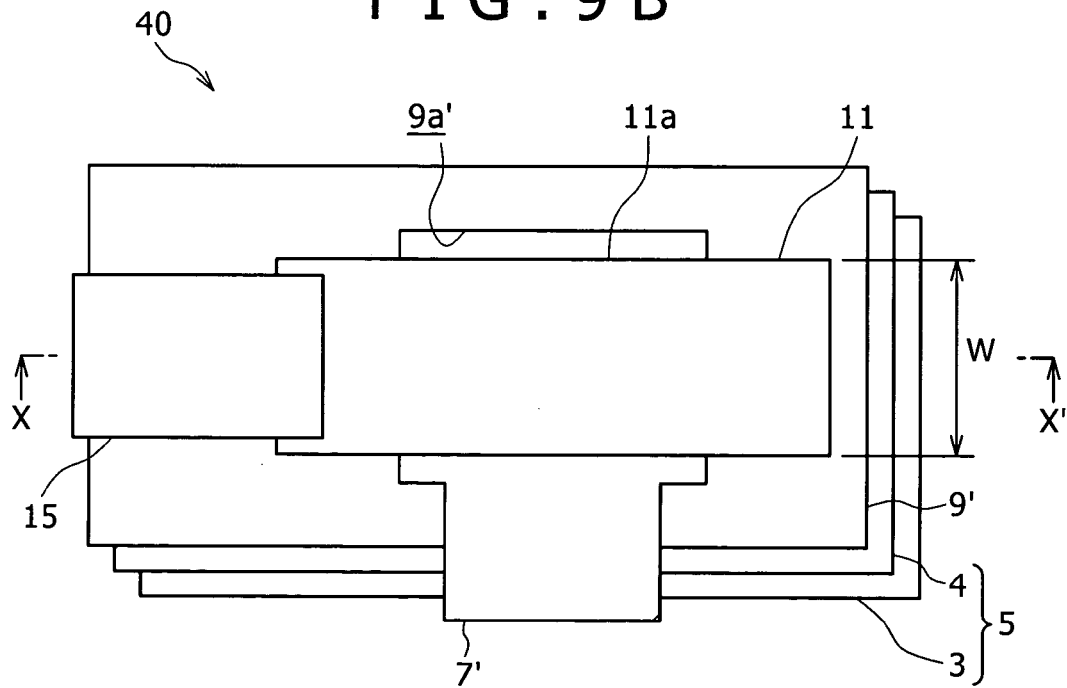

FIG. 9A is a sectional view showing the structure of the micromachine according to a fourth embodiment, and FIG. 9B is a plan view showing the structure of the micromachine according to the fourth embodiment. The cross section in FIG. 9A is taken along the line X–X' in FIG. 9B.

The micromachine 40 according to the fourth embodiment is similar to the micromachine according to the first embodiment (which has been mentioned above with reference to FIGS. 1A and 1B) except for the output electrode 7' which is formed in a groove.

The micromachine 40 shown in FIGS. 9A and 9B has the output electrode 7' which is formed in the opening 9a' of the interlayer insulating film 9', such that the upper surface of the output electrode 7' is entirely exposed from the interlayer insulating film 9'. Therefore, the opening 9a' in the interlayer insulating film 9' is formed such that the lead extending from the output electrode 7' is also exposed.

The above-mentioned micromachine according to the fourth embodiment is produced by the method which is described below with reference to FIGS. 10A to 10D and FIG. 11 (which are sectional views).

Figure 10A:
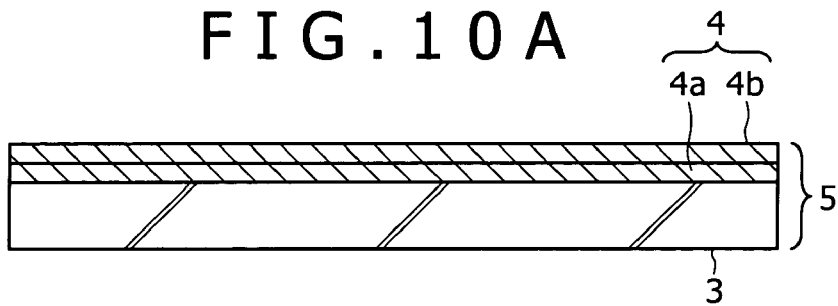
FIGS. 10A to 10D are sectional views showing the production method according to the fourth embodiment of the present invention.

In the first step shown in FIG. 10A, the substrate 5 is prepared by coating a semiconductor substrate 3 with an insulating film 4 in the same way as in the first embodiment which has been mentioned above with reference to FIG. 2A.

Figure 10B:
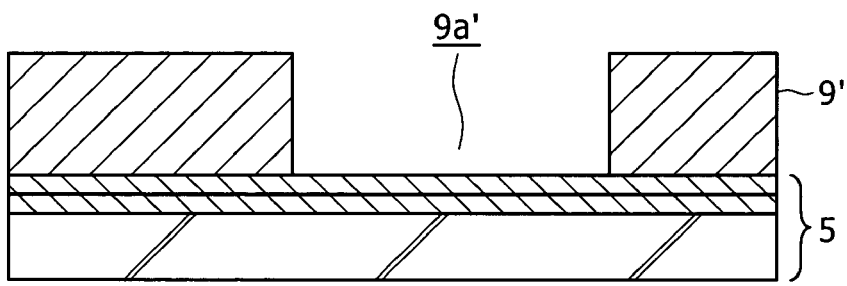

In the next step shown in FIG. 10B, the interlayer insulating film 9' is formed on the substrate 5, and then the opening 9a' (reaching the substrate 5 or the insulating film 4) is formed in the interlayer insulating film 9.

Figure 10C:
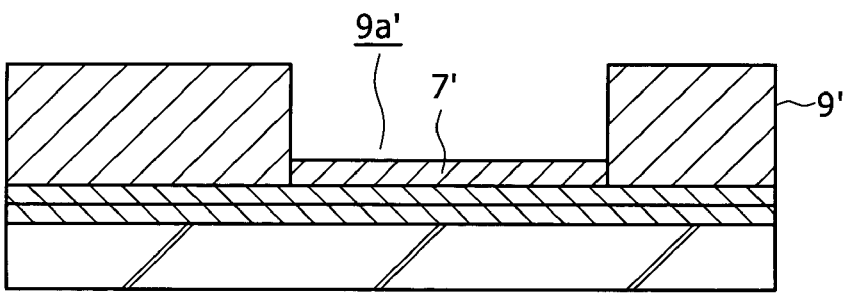

In the subsequent step shown in FIG. 10C, the output electrode 7' is formed in the opening 9a'. In practice, a first conductive layer of polysilicon is formed on the interlayer insulating film 9' so as to fill the opening 9a', and then the first conductive layer on the interlayer insulating film 9' is removed by CMP process. The first conductive layer in the opening 9a' undergoes etch-back, so that the output electrode 7' of the first conductive layer is made sufficiently thinner than the interlayer insulating film 9'.

Figure 10D:
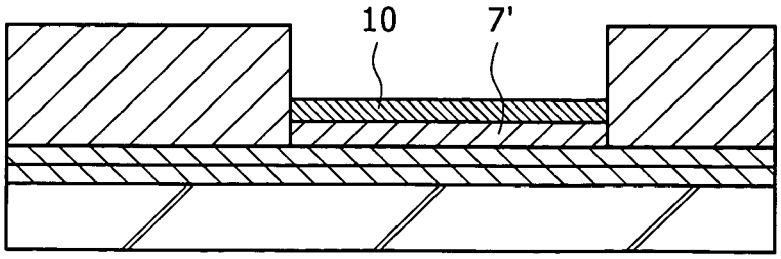

In the next step shown in FIG. 10D, the sacrificial layer 10 is selectively formed on the exposed surface of the output electrode 7' in the same way as in the first embodiment which has been mentioned above with reference to FIG. 2D. The ensuing steps are the same as those in the first embodiment which have been mentioned above with reference to FIGS. 3A and 3C. In this way there is obtained the micromachine 40 which has been mentioned above with reference to FIGS. 9A and 9B.

The above-mentioned micromachine 40 according to the fourth embodiment has the resonator electrode 11 which traverses above the space A in the opening 9a', and the side of the beam (vibrating part) 11a of the resonator electrode 11 is supported by the side walls of the opening 9a'. Therefore, it has a high Q value as in the case of the micromachine according to the first embodiment. It will find use as a high-frequency filter for higher frequency bands.

Fifth Embodiment

Figure 11:
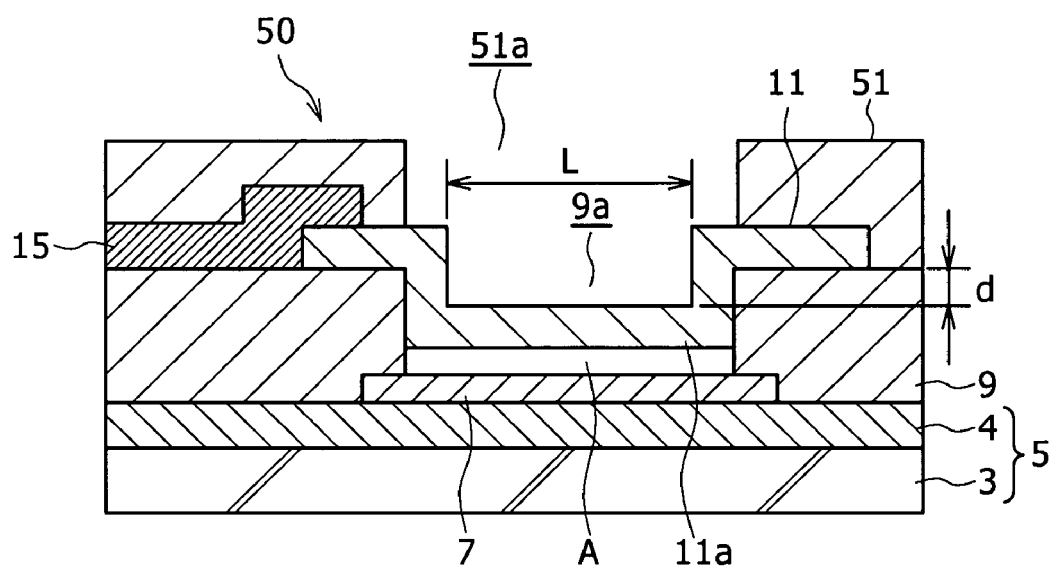
FIG. 11 is a sectional view of the micromachine according to a fifth embodiment of the present invention.

FIG. 11 is a sectional view showing the structure of the micromachine according to a fifth embodiment. The micromachine 50 according to the fifth embodiment is similar to the micromachine according to the first embodiment (which has been mentioned above with reference to FIGS. 1A and 1B) except for the insulating film 51 which is additionally formed on the interlayer insulating film 9 in such a way as to cover the resonator electrode 11.

The micromachine 50 has the resonator electrode 11 which is supported on the interlayer insulating film 9. In other words, both ends of the vibrating part 11a of the resonator electrode 11 are held between the interlayer insulating film 9 and the insulating film 51 placed thereon. The lead 15 is also held between the interlayer insulating film 9 and the insulating film 51.

The interlayer insulating film 9 has an opening which is designated as a first opening 9a. The insulating film 51 placed on the interlayer insulating film 9 has an opening which is designated as a second opening 51a. The first opening 9a coincides approximately with the second opening 5a (in terms of shape and position). The second opening 51a should be large enough to permit the vibration of the vibrating part 11a.

The above-mentioned micromachine according to the fifth embodiment is produced by the method which is described below with reference to FIGS. 12A and 12B (which are sectional views).

First, the resonator electrode 11 and the lead 15 are formed on the interlayer insulating film 9 in the same way as in the first embodiment which has been explained above with reference to FIGS. 2A to 2D and FIGS. 3A to 3C.

Figure 12A:
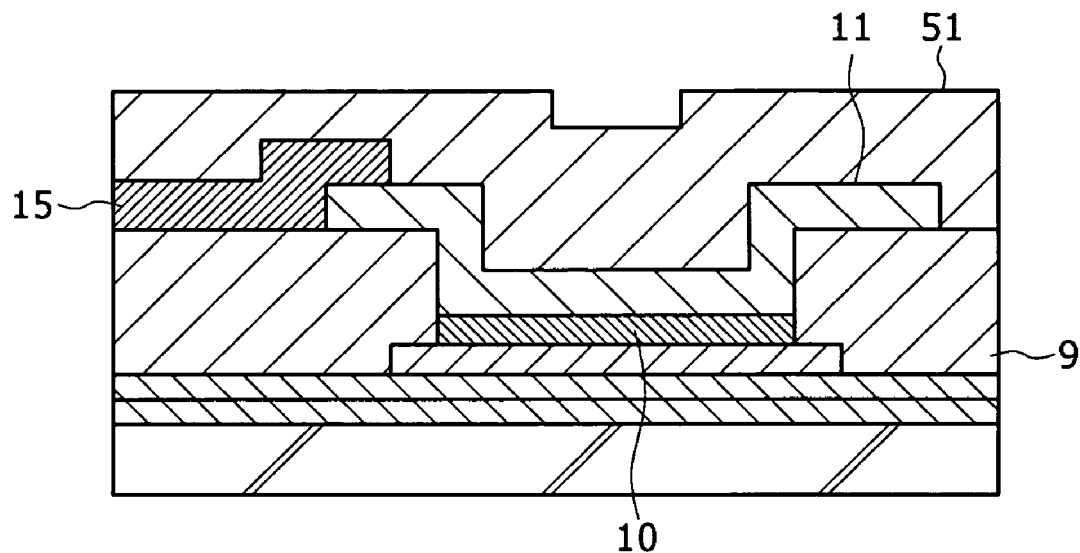
FIGS. 12A and 12B are sectional views showing the production method according to the fifth embodiment of the present invention.

In the next step shown in FIG. 12A, the insulating film 51 is formed on the interlayer insulating film 9 in such a way that it covers the resonator electrode 11 and the lead 15. The material for the insulating film 51 should be an insulating material, such as silicon nitride, which is resistant to etching to be performed subsequently on the sacrificial layer 10.

Figure 12B:
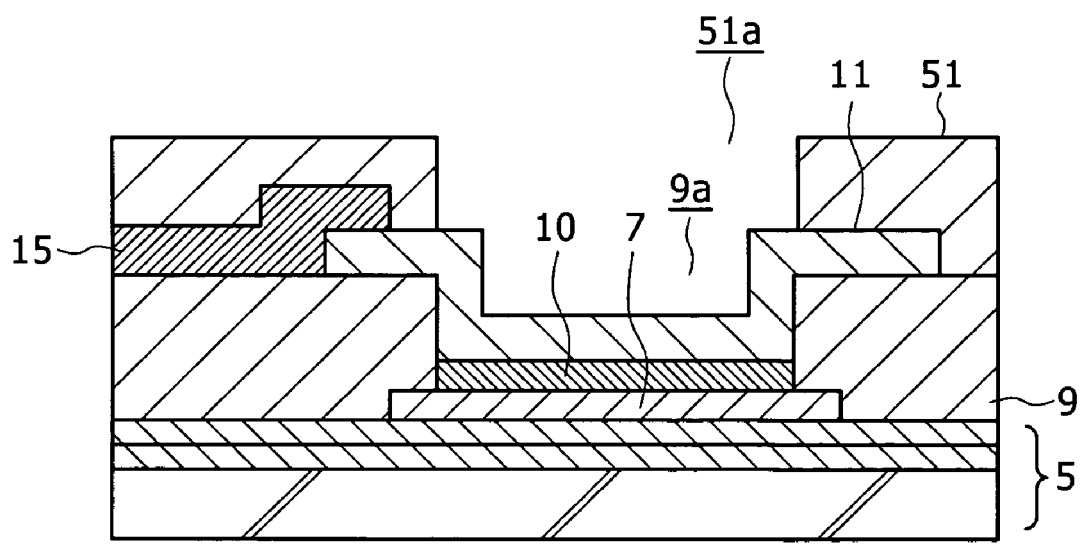

In the next step shown in FIG. 12B, the second opening 51a is formed in the insulating film 51. (The second opening 51a overlaps with the first opening 9a in the interlayer insulating film 9.) The sacrificial layer 10 of silicon oxide under the resonator electrode 11 is removed by selective wet etching with buffered hydrofluoric acid on the resonator electrode 11, the interlayer insulating film 9, the output electrode 7, and the insulating film 51.

The selective etching forms the space A, prepared by removing the sacrificial layer, under the resonator electrode 11 and causes the output electrode 7 to be exposed at the bottom of the first opening 9a, as shown in FIG. 11. Thus there is obtained the micromachine 50 which has the beltlike resonator electrode 11 which rests on the interlayer insulating film 9 and traverses the space A in the first opening 9a.

The micromachine 50 according to the fifth embodiment, which is constructed as mentioned above, has the resonator electrode 11 which closes the space A in the opening 9a in such a way that the side of the beam (vibrating part) 11a of the resonator electrode 11 is supported by the side wall of the opening 9a. Moreover, both ends of the vibrating part 11a of the resonator electrode 11 are held between the interlayer insulating film 9 and the insulating film 51 formed thereon. This structure supports the resonator electrode 11 more firmly than that in the first embodiment. Therefore, the micromachine according to the fifth embodiment has a high Q value more certainly than in the case of the micromachine according to the first embodiment. It will find use as a high-frequency filter for higher frequency bands.

Sixth Embodiment

Figure 13:
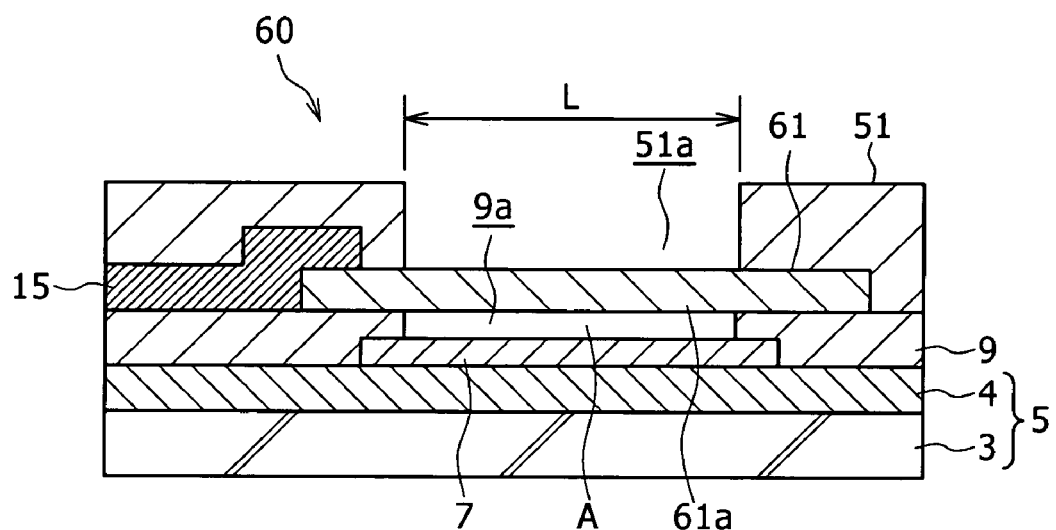
FIG. 13 is a sectional view of the micromachine according to a sixth embodiment of the present invention.

FIG. 13 is a sectional view showing the structure of the micromachine according to a sixth embodiment. The micromachine 60 according to the sixth embodiment is a modification of the micromachine according to the fifth embodiment which has been mentioned above with reference to FIG. 11. The micromachine 60 according to the sixth embodiment is similar to the micromachine according to the fifth embodiment except for the structure of the resonator electrode 61.

The micromachine 60 is characterized in that the resonator electrode 61 does not have any part which is concave toward the output electrode 7 and its shape including its vibrating part 61a is flat and that the vibrating part 61a of the resonator electrode 61 has its both ends held between the interlayer insulating film 9 and the insulating film 51 thereon and the lead 15 is also held between the interlayer insulating film 9 and the insulating film 51.

The micromachine 60 which has the resonator electrode 61 constructed as mentioned above may be produced in a way similar to that of the first embodiment. In the step of forming the sacrificial layer 10 (which has been explained with reference to FIG. 2D), the sacrificial layer 10 is formed as high as the opening 9a, and the subsequent steps are carried out in the same way as in the fifth embodiment.

The micromachine 60 according to the sixth embodiment, which is constructed as mentioned above with reference to FIG. 13, has the resonator electrode 61 which traverses above the space A in the opening 9a. Therefore, as in the case of the first embodiment, when the resonator electrode 11 is caused to vibrate by application of a voltage of specific frequency, the vibrating part 61 traversing above the opening 9a vibrates and this part functions as the vibrating part 61a of the resonator electrode 61. It follows, therefore, that the length (beam length L) of the vibrating part 61a is determined by the size of the opening 9a.

Consequently, as explained above for the first embodiment, the micromachine 60 is adaptive to higher frequencies by reduction of the beam length L while maintaining the desired level of output.

The micromachine 60 according to the sixth embodiment is constructed in the same way as in that according to the fifth embodiment. That is, both ends of the resonator electrode 61 (or the anchor parts supporting the vibrating part 61a) are held between the interlayer insulating film 9 and the insulating film 51 thereon. This means that the resonator electrode 61 is firmly supported by the interlayer insulating film 9 and the insulating film 51. Thus, only the vibrating part is made to contribute to vibration. As the result, when the resonator electrode 61 is caused to vibrate by application of a voltage of specific frequency, only the beam (vibrating part) 61a vibrates. Therefore, the natural frequency becomes closer to the theoretical value (inversely proportional to the square of the length L of the vibrating part) which meets the equation (1) given above. This easily makes the micromachine adaptive to high frequencies by miniaturization.

Here, FIG. 4 shows the result of simulation to predict how the natural frequency varies depending of the beam length L in the micromachine 60 according to the sixth embodiment. It is to be noted that in the case of the micromachine 60 according to the sixth embodiment, the dependence of natural frequency of the beam length is close to the theoretical value meeting the equation (1) given above. This result indicates that the micromachine 60 can be made to easily suit high frequencies by miniaturization.

Incidentally, in the sixth embodiment, the resonator electrode 61 may have wide ends which ensure the supporting of the beam (vibrating part) 61a, so that the natural frequency increases further.

In addition, the third to six embodiments may be combined with the second embodiment, so that the opening is closed by the resonator electrode. This enhances the effects of the third to sixth embodiments and increases the natural frequency by firmly supporting the resonator electrode.

As mentioned above, the present invention pertaining to the micromachine and its production method offers the advantage that the beam length or the length of the vibrating part of the resonator electrode can be made shorter than the width of the output electrode and yet the capacity between the output electrode and the resonator electrode can be made large relative to the length of the vibrating part, and the resonator electrode can be firmly supported by the interlayer insulating film. This permits the reduction of the beam length and causes the natural frequency to approach the theoretical value. Therefore, the resulting micromachine has a high Q value and is adaptive to high frequency bands.

The invention claimed is:

1. A micromachine comprising:
an output electrode which is patterned on a substrate;
an interlayer insulating film which covers said substrate and includes an opening whose bottom is said output electrode; and
a beltlike resonator electrode so formed on said interlayer insulating film as to traverse above the space in said opening,
wherein said resonator electrode is concave toward said opening along the side wall of said opening.

2. The micromachine as defined in claim 1, wherein the resonator electrode is formed in such a way that the surface of the part concave toward the opening is lower than the surface of the interlayer insulating film.

3. The micromachine as defined in claim 1, wherein both ends of the resonator electrode, which are at both sides of the opening, are held between the interlayer insulating film and an insulating film formed on the interlayer insulating film.

4. The micromachine as defined in claim 1, wherein the resonator electrode is so arranged as to close the opening and includes a hole communicating with the space in the opening.

5. The micromachine as defined in claim 1, wherein the output electrode is embedded in the interlayer insulating film.

6. A micromachine comprising:
an output electrode which is patterned on a substrate;
an interlayer insulating film which covers said substrate and includes an opening whose bottom is said output electrode; and
a beltlike resonator electrode so formed on said interlayer insulating film as to traverse above the space in said opening,
wherein both ends of the resonator electrode, which are at both sides of the opening, are held between the interlayer insulating film and an insulating film formed on the interlayer insulating film.

7. The micromachine as defined in claim 6, wherein the resonator electrode is so arranged as to close the opening and includes a hole communicating with the space in the opening.

8. The micromachine as defined in claim 6, wherein the output electrode is embedded in the interlayer insulating film.

9. A method for producing a micromachine comprising:
a first step of patterning an output electrode on a substrate and forming on said substrate an interlayer insulating film including an opening whose bottom is said output electrode;
a second step of forming at the bottom of said opening a sacrificial layer whose surface is lower than the surface of said interlayer insulating film so as to cover the surface of the output electrode at the bottom of the opening by the sacrificial layer;
a third step of patterning a beltlike resonator electrode on said sacrificial layer and said interlayer insulating layer in such a way that the beltlike resonator electrode is concave toward said opening along the inner wall of said opening, said beltlike resonator electrode traversing above said sacrificial layer while allowing a part thereof to be exposed; and
a fourth step of selectively removing said sacrificial layer in said opening, thereby forming a space between said output electrode and said resonator electrode.

10. A method for producing a micromachine comprising:
a first step of patterning an output electrode on a substrate and forming on said substrate an interlayer insulating film including a first opening whose bottom is said output electrode;
a second step of covering with a sacrificial layer the surface of said output electrode as the bottom of said first opening;
a third step of patterning a beltlike resonator electrode on said sacrificial layer and said interlayer insulating layer, said beltlike resonator electrode traversing above said sacrificial layer while allowing a part thereof to be exposed;
a fourth step of forming an insulating film on said interlayer insulating film in such a way that the insulating film covers said resonator electrode and forming a second opening in said insulating film so that said resonator electrode and said sacrificial layer are exposed; and
a fifth step of selectively removing said sacrificial layer in said first opening through said second opening, thereby forming a space between said output electrode and said resonator electrode.

* * * * *